United States Patent [19]

Mayrand

[11] Patent Number: 4,489,341
[45] Date of Patent: Dec. 18, 1984

[54] MERGED-TRANSISTOR SWITCH WITH EXTRA P-TYPE REGION

[75] Inventor: James F. Mayrand, Shrewsbury, Mass.

[73] Assignee: Sprague Electric Company, North Adams, Mass.

[21] Appl. No.: 423,967

[22] Filed: Sep. 27, 1982

[51] Int. Cl.³ ............................................. H01L 27/02
[52] U.S. Cl. ...................................... 357/51; 357/35; 357/41; 357/43; 357/44; 357/46
[58] Field of Search ..................... 357/51, 46, 35, 41, 357/44, 43

[56] References Cited

U.S. PATENT DOCUMENTS

| | | | |
|---|---|---|---|
| 3,401,319 | 9/1968 | Watkins | 357/43 |
| 3,731,164 | 5/1973 | Cheney | 317/235 |
| 3,969,747 | 7/1976 | Tsuyuki et al. | 357/44 |
| 4,038,680 | 7/1977 | Yagi et al. | 357/44 |
| 4,072,975 | 2/1978 | Ishitani | 357/41 X |
| 4,233,615 | 1/1980 | Takemoto et al. | 357/51 X |
| 4,244,000 | 1/1981 | Ueba et al. | 357/51 X |
| 4,253,107 | 2/1981 | Macdougall | 357/51 X |
| 4,309,716 | 1/1982 | El-Kareh | 357/51 X |
| 4,367,509 | 1/1983 | Snyder et al. | 357/51 X |
| 4,380,021 | 4/1983 | Matsuyama et al. | 357/35 X |
| 4,392,069 | 7/1983 | Suzuki et al. | 357/35 X |

OTHER PUBLICATIONS

Carballo, R. A. and Ing. P. W., "Self-Contained Bipolar-FET Device", IBM Technical Disclosure Bulletin, vol. 19, No. 11, Apr. 1977, pp. 4191-4192.

Primary Examiner—Andrew J. James
Assistant Examiner—William A. Mintel

[57] ABSTRACT

In one N-type epitaxial pocket of an integrated circuit there is formed a vertical NPN transistor and two other P-type regions each positioned adjacent but spaced from the P-type base region of the NPN. A metal gate over the gap between the base and one of the other P-type regions forms a high input-impedance P-MOS stage driving the NPN. A metal layer contacts both the NPN emitter and the PNP emitter formed by the third P-type region. This PNP transistor clamps the NPN collector-emitter to a safe voltage when switching an inductive load, and in a particularly efficient manner. A second P-MOS transistor is formed by extending the metal layer over the gap between the NPN-base and the third P-type region which transistor is capable of preventing leakage current out of the input P-MOS transistor in the off state form turning on the NPN transistor.

10 Claims, 9 Drawing Figures

|  | Winding | | | |
|---|---|---|---|---|
|  | 16 | 18 | 24 | 26 |
| $S_1$ | 1 | 0 | 1 | 0 |
| $S_2$ | 0 | 1 | 1 | 0 |
| $S_3$ | 0 | 1 | 0 | 1 |
| $S_4$ | 1 | 0 | 0 | 1 |

Phase 4,489,341

1

MERGED-TRANSISTOR SWITCH WITH EXTRA P-TYPE REGION

BACKGROUND OF THE INVENTION

This invention relates to a merged-transistors switch and more particularly to an integrated circuit (IC) driver for an inductive load such as a PM motor load.

A permanent-magnet type stepping motor, otherwise known as a PM motor, has a rotor that includes a permanent magnet. Magnetic flux reversal occurs in each stator pole, and therefore each pole must be provided with two separate but closely coupled windings, one for each direction of magnetization. It is common practice to employ a transistor switch to control each winding, driving DC current first through one of the windings and then through the other so that each winding is excited when the other is not.

In FIG. 1 there is shown an elementary circuit for driving a PM stepping motor having two poles 12 and 14. Two bifiler windings 16 and 18 are connected together at opposite-polarity ends thereof. The other winding ends are connected to the emitters of two NPN transistors 20 and 22, respectively at the other pole 14 and the two windings 24 and 26 are similarly related to transistors 28 and 30.

The appropriate driving sequence for this circuit is shown in the Table of FIG. 2 wherein, $S_1$, $S_2$, $S_3$, $S_4$ represent successive phases or periods of time and wherein a "1" denotes the presence of a drive current in a winding and a "0" represents zero drive current.

The transistors 20 and 22 at pole 12, for example are thus turned on alternately to drive the PM motor. During a transition, e.g. from phase 3 to phase 4, when one transistor, e.g. 22, is turning off and the current through the transistor (22) essentially ceases flowing while, due to tight mutual coupling between the winding 16 and 18, a back-e.m.f. in the other winding 18, begins to establish an equal value current conducting through diode 34. Diode 34 conducts momentarily in the forward direction and shunts the resulting transient current away from its companion transistor 20.

At this transition, a large negative voltage spike appears at the emitter of (the off) transistor 22. It is conventional to provide additional diodes, e.g. 35, to limit this negative spike violtage. A battery 36 is connected between ground and the collectors of transistors 20,22,28 and 30.

This invention concerns a merged switch that is particularly suitable for switching currents in a load having a high L/R ratio. For example, the switch of this invention can provide the same function as do the pair, transistor 20 and shunting diode 34 (or the pair 22 and 32) in FIG. 1.

It is an object of this invention to provide a more efficient merged-switching transistor device for use in driving a load having a high L/R ratio, such as a PM motor.

SUMMARY OF THE INVENTION

A merged-transistors switch is formed in a portion of an N-type silicon chip and includes the known combination of a double-diffused-vertical NPN transistor and another P-type region adjacent to and spaced from the P-type base region of the NPN transistor. Thus the low-input impedance bipolar transistor is converted to a high input impedance device.

2

According to one aspect of this invention a third P-type region is formed in the N-type chip portion adjacent and spaced from another portion of the P-type base region to form a lateral PNP transistor. A metal layer contacts both the emitter of the NPN transistor and the third P-type region. At the moment of switching an inductive load during which a positive fly-back voltage appears at the emitters of the NPN and the PNP transistors, this lateral PNP saturates and for the duration of the transient turns on the NPN transistor in the reverse mode of conduction. Thus the transient fly-back current is carried by both transistors keeping temperature gradients in the silicon to a minimum, and quickly dispatching the stored energy in the inductive load.

By the additional step of extending the metal layer of the emitters over the gap between the two P-type regions, another P-MOS transistor is formed that is capable of turning on during those periods that the input P-MOS transistor is turned off so as to divert leakage current from that input P-MOS transistor that might otherwise tend to turn on the NPN transistor in those periods. This function may be of no consequence if the merged-transistors were used as a linear amplifier, but for switching applications it can clearly be an important one.

DESCRIPTION OF THE PREFERRED EMBODIMENTS

Figure 3:
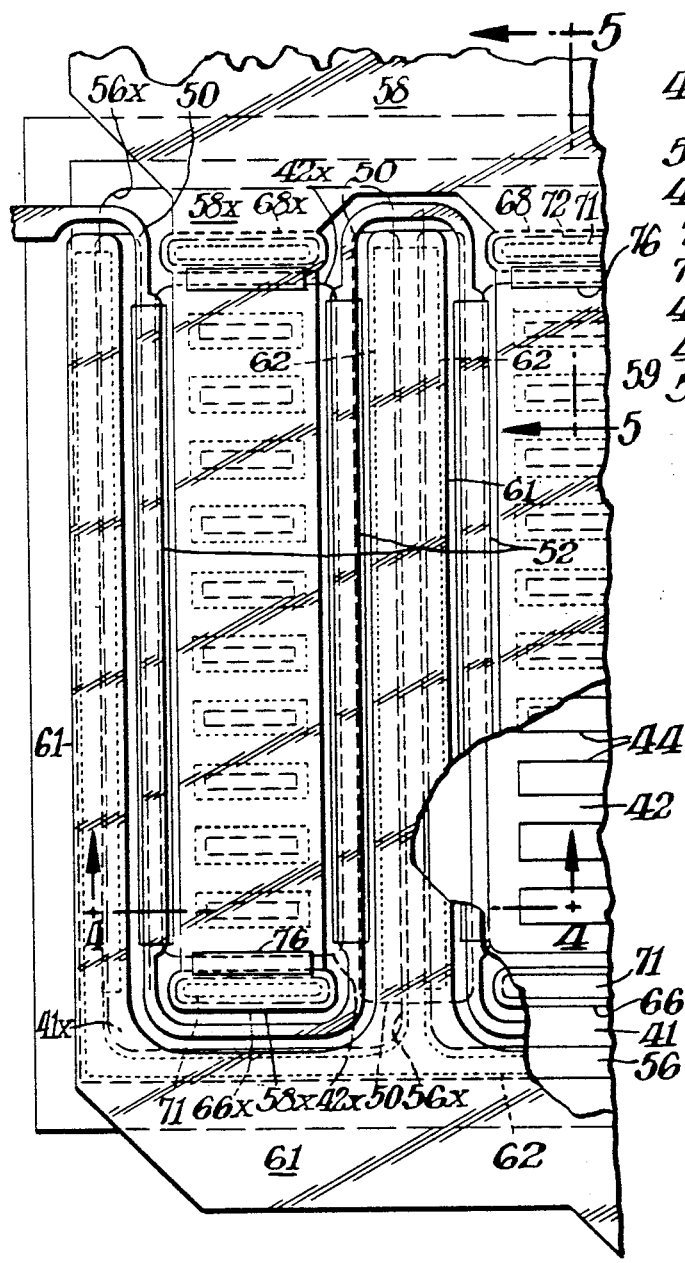
FIG. 3 shows in top view an IC merged transistor structure of this invention having a portion of the oxide and metal removed in one area to more clearly reveal the doped silicon regions there.
Figure 5:
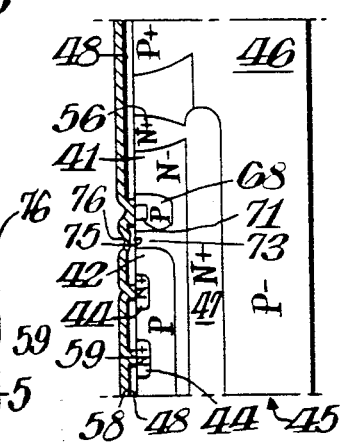
FIG. 5 shows in a side sectional view the merged transistor of FIG. 3 taken in plane 5—5.
Figure 4:
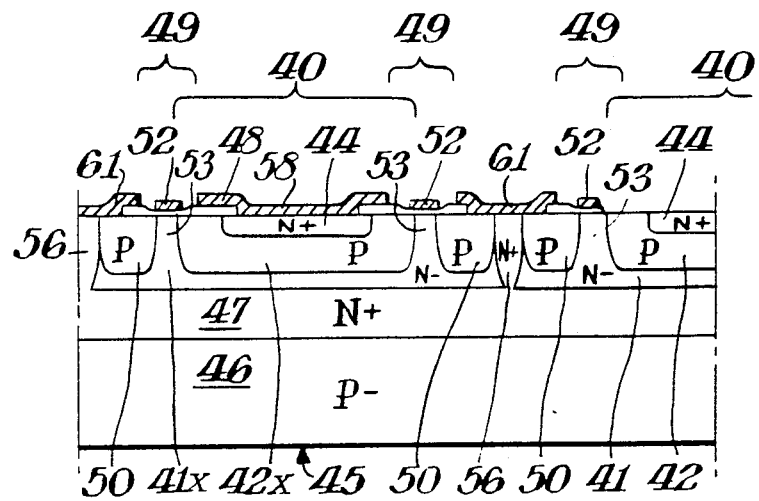
FIG. 4 shows in a side sectional view the merged transistor of FIG. 3 taken in plane 4—4.
Figure 6:
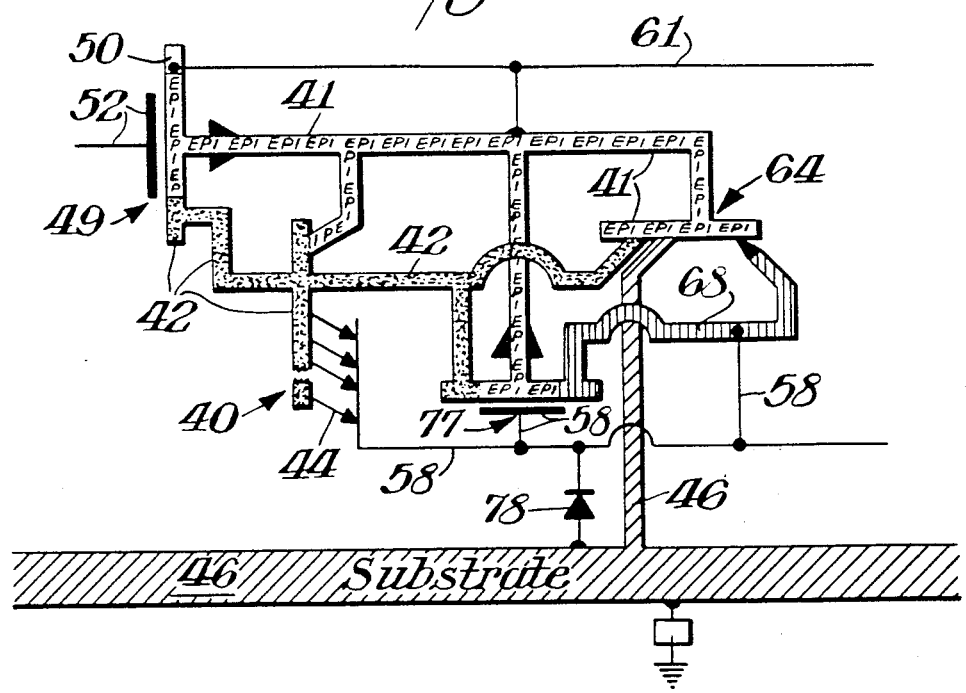
FIG. 6 shows a special circuit diagram representing the merged structure of FIGS. 3, 4 and 5, and indicating the doped semiconductor regions that are shared to accomplish the merging.
Figure 7:
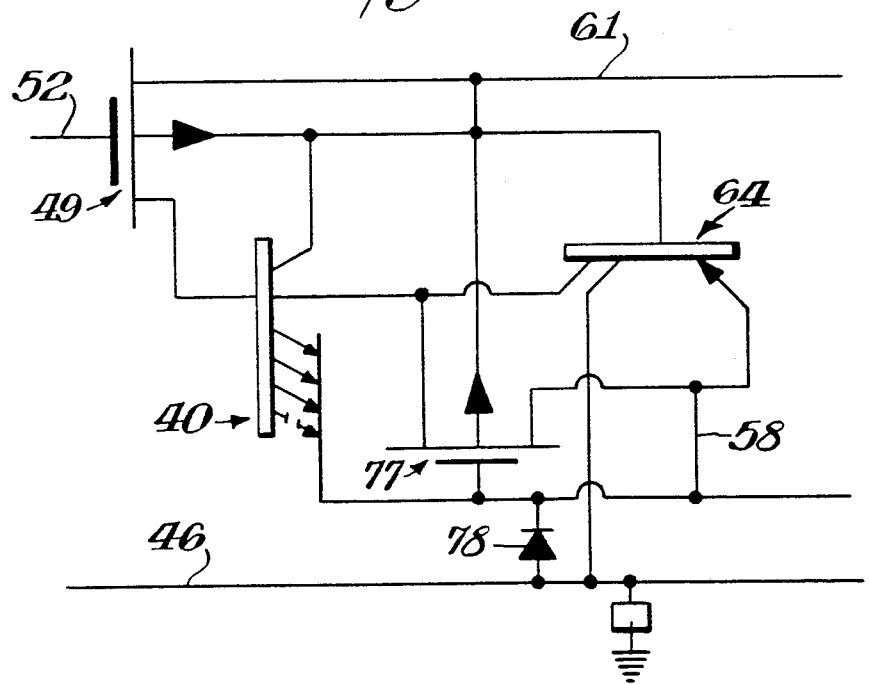
FIG. 7 shows a conventional type circuit diagram representing the merged transistor of FIGS. 3, 4 and 5.

Referring to FIG. 4 for structural features and referring to FIGS. 6 and 7 for circuit features, a power NPN transistor 40 is formed in an isolated N-type epitaxial pocket 41 that serves as collector. Also see FIGS. 4 and 5. A P-type base region 42 is formed in the epitaxial pocket 41. A multiplicity of N-type emitter regions 44 are formed in the base regions 42. Besides being shown in FIGS. 3, 4 and 5, these regions 41, 42 and 44 are represented schematically in FIG. 6. The NPN power transistor 40 is intended to be used as one of four (or more) integrated switches for driving a PM motor as are switching transistors 20, 22, 28 and 30 of FIG. 1.

This integrated circuit is formed in a silicon chip 45 as shown in FIG. 5. The chip 45 is a P-type substrate 46 having grown there over the epitaxial layer 41. A buried layer 47, heavily doped with N-type impurities is formed at the interface between the P- substrate 40 and the N- epitaxial layer 41. A silicon dioxide passivating layer 48 is formed over the epitaxial layer 41.

A P-channel enhancement-mode MOS transistor 49 is also formed in the N-type epitaxial pocket 41 as seen in FIG. 4. The source is P-type regions 50 each of which is formed adjacent but spaced from the side edges of a region 42 that not only serves in transistor 49 as the drain but, as noted above, is the base of transistor 40. A metal strip 52 overlies each gap or channel 53 between the P-type source and drain regions 50 and 42, and serves as the gate electrode of transistor 49.

In this preferred embodiment, the collector contact regions are heavily doped N-type walls 56. With reference to FIGS. 4 and 5 it is seen that these walls extend completely through the epitaxial layer 41 to the buried layer 47. Walls 56 also form a network of closed epitaxial portions or cells, e.g. the epitaxial cell 41x bounded by wall portions 56x. The large base region 42x occupies the center of the cell 41x and at the long-side edges thereof there are two elongated source regions 50 shown in the top view of FIG. 3.

A metal film 58 has a number of fingers, each of which (58x) extends (downward as shown in FIG. 3) over each cell (41x) and contacts through holes 59 provided in the silicon dioxide layer 48 the ten emitters 44 that are formed in that base region 42x.

Another metal film 61 also has a number of fingers that are interdigitated with those of film 58. Film 61 overlies a major portion of the network of N+ walls 56 and contact the walls 56 through slot apertures 62 provided therefor in the silicon dioxide layer 48.

Another group of bipolar transistors 64 are formed in the same epitaxial pocket 41. For example, two such PNP transistors 64 are formed in the epitaxial cell 41x at opposite ends of the elongated P-type base region 42x as seen in FIG. 3. This is accomplished by forming two small P-type regions 66 and 68, respectively, at the two ends of the elongated base region 42x. A central region 71 in each of the small P-type regions 66 and 68 may be heavily doped with N-type impurities as shown in FIG. 5. The metal 58 contacts both N-type region 71 and the P-type region 68. Holes 72 are provided in the oxide layer 48 through which those metal contacts are made.

Figures 1, 2:
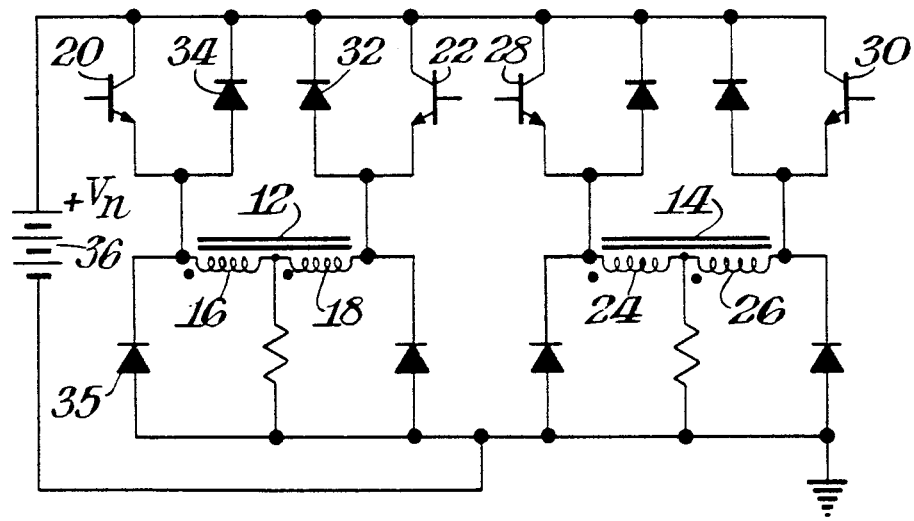
FIG. 1 shows a circuit diagram of a simple driver for a 2-pole PM motor.
FIG. 2 shows a chart showing a typical condition (conducting or not conducting) of the four motor windings as a function of the four sequential phases of motor drive.

PNP transistors 64 serve the same function in the merged-transistors structure of the present invention as is the function of the separate diodes 32 and 34 in the prior art circuit of FIG. 1. But as will be shown, the PNP transistors 64 also serve another purpose as is described further below.

Referring to the FIG. 5, the silicon dioxide passivation layer 48 is made very thin in an area 75 directly over the gap 73 between the P-type base region 42 of NPN transistor 40, to permit the portion of the metal film 58 to come very close to the N-type epitaxial region 41 and form a second P-MOS transistor 77 of practical sensitivity. Transistor 77 therefore has a drain 68 and a source 42 formed in epitaxial region 41 and with a gate 58 which is illustrated also in FIG. 6.

An especially thin conventional-gate-quality silicon oxide 75 is provided over the channel region of the P-MOS transistor 77. The depression 76 in metal layer 58 in FIG. 3 corresponds to this thin gate oxide area 75. A similar thin oxide area is provided in the input-P-MOS transistor 49 but the corresponding depression in metal film 52 is omitted in FIG. 3 to avoid obscuring other significant detail.

Referring to FIG. 6, the second P-MOS transistor 77 is turned on when the input P-MOS transistor 49 and the NPN transistor 40 are turned off, because the emitters of transistor 40 and thus the gate 58 of transistor 77 have become more negative relative to the epitaxial region 41. Transistor 77 provides a path by which leakage current from transistor 49 is diverted from the base-emitter junction of transistor 41 during any phase in which transistors 49 and 40 are turned off.

When operating as one of several current switches driving a stepping motor (e.g. like transistor 20 and diode 34 in FIG. 1), the merged transistor structure of FIGS. 3, 6 and 7 has a positive going voltage applied to the base of transistor 40 to turn it on and the positive inductive spike elevates the voltage at the emitters of transistor 40 and the gate 58. The transistor 64 is turned on and saturates holding the base of transistor 40 to a near ground voltage, namely to the voltage across the load at line 58. This in turn causes momentary reverse mode operation of transistor 40 so that it conducts in the reverse direction. As a result, almost the entire merged structure conducts momentarily and the high transient current at switching is distributed more evenly throughout the merged structure rather than being concentrated in the vicinities of the base-emitter junction of the NPN 40 as in the prior art. In other words, when the companion NPN transistor (not shown but like transistor 32 in FIG. 1) is turned off, output node 58 is positive with respect to supply voltage $V_M$ at buss 61, and for an initial transient moment of typically 100 $\mu$sec., transistor 40 conducts in the reverse direction sharing the transient current with transistor 64. Thereafter, transistor 40 conducts in the forward direction and transistor 64 becomes non-conducting until at the beginning of a subsequent phase, transistor 49 is switched off.

Thus when the merged transistor that includes NPN 40 enters a conduction phase (e.g. a phase $S_4$ as in FIG. 2) that was preceeded by a non-conducting phase (e.g. phase $S_3$ of FIG. 2), the above-described inductive transient occurs. It might have been assumed that an input P-MOS transistor (e.g. 49) should always be gated on during those phases when its merged companion NPN transistor (e.g. 40) enters a conduction phase (e.g. $S_1$ and $S_4$). However, the input gate driving signals for turning on the merged transistor of this invention are preferably delayed by the duration of the transient to avoid shunting the base-collector current of the reverse biased NPN (40). A fixed delay of a little more than the expected duration of the transient would be easy to implement and provide near optimum operating results.

In a subsequent off phase (e.g. $S_2$) only transistor 77 conducts to divert the leakage current of the off-transistor 49 away from the base emitter junction of transistor 40 and avoid the tendency for transistor 40 to be inadvertently turned on thereby.

Diode 78, not a part of the merged transistors of this invention, may be fabricated elsewhere in the integrated circuit and serves the same purpose as does diode 35 in FIG. 1.

In the merged transistors switch of this invention, the base 42 of the NPN transistor 40 is floating, i.e. there is no need and no provision for the base 42 to be contacted by a metal conductor making possible the efficient interdigitated metal structure of FIG. 3. The P-MOS transistor 49, whose P-type drain region is also in fact the above said base 42, is the source of base current to the NPN transistor 40.

When in the prior art, a metal conductor contacts the base region of a power transistor, that contact may take the form of a plurality of small spaced contact areas along the base. Such a contact arrangement helps to keep the base current evenly distributed within the base. However a base current hogging phenomena appears whereby near one of the emitters that for any reason carries slightly more current than the other emitters, the temperature rises. The negative temperature coefficient of the adjacent P-channel region 53 leads to an even higher current flowing in the base at that "higher current emitter" site. Such base-current hogging can run away, destroying the transistor. Isothermal lines (not shown) would generally be horizontal in FIG. 8.

Figure 8:
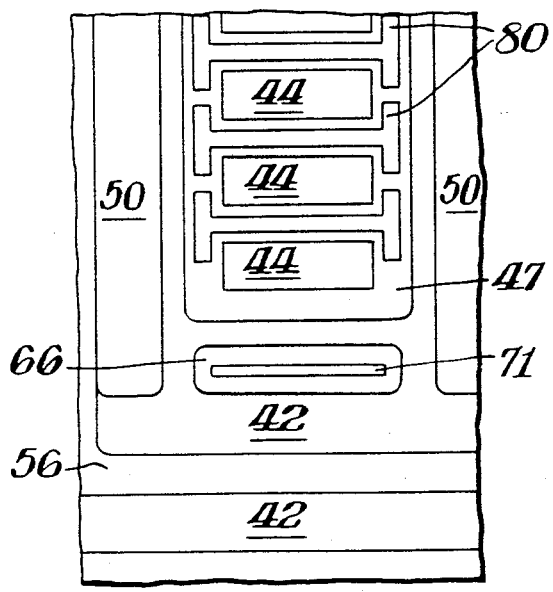
FIG. 8 shows in top view a detail of the merged structure of FIG. 3 with the oxide and metal removed.
Figure 9:
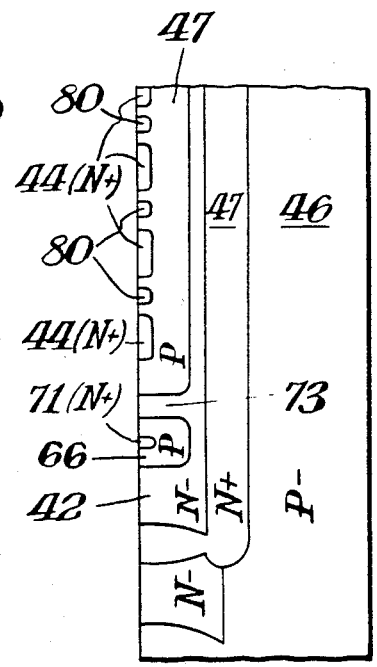
FIG. 9 shows in side sectional view the structure of FIG. 8.

With reference to FIG. 8, a pattern of base current ballasting regions 80 consist of H-shaped regions each having a high P-type conductivity relative to that of the bulk of the base region 42. Each such H-shaped region 80 is interposed between an adjacent pair of the emitters 44. In the preferred embodiment, the gaps 82 between the adjacent of the H-shaped regions 80 are adjusted so that the approximate resistance of a gap 82 is about 200 ohms, while the base resistance is reduced by a region 80 from the P-channel 53 to an emitter 44 to a value of about 25 ohms. These ballasting regions 80 were omitted from FIGS. 3, 4 and 5 in the interest of clarity.

The positive temperature coefficient of current gain, $\beta$, of the NPN transistor 40 tends to compensate for the negative TC of the channel 53 of P-MOS transistor 49. However, keeping in mind the horizontal isothermal lines, adjacent emitters 44 being at different temperatures causes the hot high current emitter area to draw base current away from the cold one so that without any base-current ballasting regions 80, the hot area gets hotter and steals even more current from its neighbor in a runaway fashion. The ballasting regions 80 help insure that current in any emitter (44) is derived almost completely from just that portion of the channel region 53 that is adjacent the emitter (44).

The ballasting has the additional advantages that base resistance is reduced and due to the more stable uniformity of current in the base 42, the maximum peak temperature in the device for a given collector current is reduced.

The merged-transistors switch of this invention as illustrated and described herein can be included as a part of an integrated circuit. Alternatively, there need be no P- substrate 46 at all if a merged switch will be manufactured as a discrete transistor switch. In either case, it will be appreciated that it can conveniently be made by conventional integrated circuit and/or transistor techniques and can conveniently be connected to external circuitry via standard integrated circuit and/or transistor connective means.

The particular design described herein has an epitaxial layer 47 with a doping level of $10^{15}$ carriers/cm$^3$. The P-type regions 42, 50 and 68 are doped to a level of $5 \times 10^{18}$ carriers/cm$^3$ and to a depth of about 3.3 $\mu$m. The N+ emitters are about 2 $\mu$m doped to $10^{20}$ carriers/cm$^3$. The channels of the P-MOS transistors 49 and 77 are 9 $\mu$m wide. Of course, different dimensions and conductivities and opposite or complimentary conductivity types could be used.

What is claimed is:

1. A merged-transistor switch of the kind including a P-type silicon substrate (46) having an N-type epitaxial pocket (41), a double-diffused-vertical NPN transistor (40) formed in said epitaxial pocket (41) which serves as the NPN transistor collector, and including in said epitaxial pocket (41) an input P-MOS transistor (49) comprised of a P-type source region (50) formed in said epitaxial pocket (41) adjacent and spaced from a portion of the P-type base region (42) of said NPN transistor (40), and a metal gate (52) over the gap between said P-type source region (50) and base region (42), said NPN base region (42) serving as the drain of said P-MOS transistor (49), wherein the improvement comprises:

a third P-type region (68) formed in said epitaxial pocket (41) adjacent and spaced from another portion of said P-type base region (42) to form a lateral PNP transistor (64) therewith, in said N-type epitaxial pocket (41) and one metal layer (58) contacting both the emitter of said NPN transistor (40) and said third P-type region (68).

2. The merged-transistors switch of claim 1 wherein said one metal layer overlies but is spaced from the surface of said epitaxial pocket by a layer of silicon dioxide, said metal layer and a thinned portion of said oxide layer extending over the gap between said P-type base region and said third P-type region to additionally become an MOS gate and form a second P-MOS transistor.

3. The merged-transistors switch of claim 1 additionally comprising a fourth P-type region adjacent and spaced from yet another portion of said P-type base region to form another PNP transistor in said pocket, said metal layer extending over and contacting said another P-type region.

4. The merged transistors switch of claim 3 wherein said metal layer overlies but is spaced from the surface of said epitaxial pocket by a layer of silicon dioxide, said metal layer and a thinned portion of said oxide layer extending over the gap between said P-type base region and said yet another P-type region to form another gate and thus form a third P-MOS transistor.

5. The merged-transistors switch of claim 1 additionally comprising at least another N-type emitter region in said P-type base region, said metal layer contacting said at least another emitter region.

6. The merged-transistors switch of claim 5 additionally comprising a low conductivity P-type region in said P-type base region positioned between each adjacent pair of said emitter regions to provide a base-current-ballasting resistive network, a more even and stable distribution of current in said base region.

7. A merged-transistor switch comprising:
(a) a P-type silicon substrate;
(b) an electrically isolated epitaxial silicon pocket of N-type formed in said substrate;
(c) a silicon dioxide layer overlying the surface of said pocket;
(d) a vertical NPN transistor, wherein said epitaxial pocket serves as the collector, and having a P-type base region formed in said epitaxial pocket and at least one emitter region of N-type formed in said base region;
(e) a second P-type region in said epitaxial pocket adjacent but spaced from a portion of the edge of said NPN-base region;
(f) a first metal gate overlying and spaced from the surface of said epitaxial pocket by said silicon dioxide layer, said metal layer and a thinned portion of said oxide layer extending over the gap between said second P-type region and said P-type-NPN-base region, to form a first P-MOS transistor;

(g) a third P-type region in said epitaxial pocket adjacent but spaced from another edge portion of said NPN-base region; and (h) a metal film contacting said P-type base region of said NPN transistor and said third P-type region forming a PNP transistor having an emitter connected electrically via said metal film to said N-type emitter region of said NPN transistor.

8. The merged transistor switch of claim 7 wherein said metal film overlies and is spaced from said epitaxial surface by said silicon dioxide layer, said metal film and a thinned portion of said oxide layer extending over the gap between said third P-type region and said NPN-base region forming a second P-MOS transistor having a source and drain consisting of said third and base P-type regions, respectively.

9. The merged-transistor switch of claim 7 additionally comprising a low-conductivity buried layer of N-type at the interface of said substrate and said epitaxial pocket, and a high conductivity annular wall extending to said buried layer and enclosing said merged NPN, first P-MOS and PNP transistors.

10. A plurality of merged-transistor switches as in claim 9 sharing said epitaxial pocket and being electrically connected in parallel with each other.

* * * * *